United States Patent
Mizutani

(10) Patent No.: US 10,663,867 B2
(45) Date of Patent: May 26, 2020

(54) EXPOSURE APPARATUS AND ARTICLE MANUFACTURING METHOD

(71) Applicant: CANON KABUSHIKI KAISHA, Tokyo (JP)

(72) Inventor: Masaki Mizutani, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/041,130

(22) Filed: Jul. 20, 2018

(65) Prior Publication Data

US 2019/0033724 A1    Jan. 31, 2019

(30) Foreign Application Priority Data

Jul. 28, 2017   (JP) ................. 2017-146780

(51) Int. Cl.
   *G03F 7/20*    (2006.01)
   *G03F 7/00*    (2006.01)

(52) U.S. Cl.
   CPC ........ *G03F 7/70191* (2013.01); *G03F 7/0035* (2013.01); *G03F 7/706* (2013.01); *G03F 7/7085* (2013.01); *G03F 7/70141* (2013.01); *G03F 7/70258* (2013.01); *G03F 7/70266* (2013.01); *G03F 7/70725* (2013.01); *G03F 7/70008* (2013.01)

(58) Field of Classification Search
   CPC ............... G03F 7/70258; G03F 7/0035; G03F 7/70008; G03F 7/70333; G03F 7/70641; G03F 7/70191; G03F 7/70266; G03F 7/706; G03F 7/70725
   See application file for complete search history.

(56) References Cited

U.S. PATENT DOCUMENTS

| | | | |
|---|---|---|---|
| 2001/0012101 A1* | 8/2001 | Mulkens | G03F 7/70058 355/67 |
| 2003/0184719 A1* | 10/2003 | Shima | G03F 7/703 355/52 |
| 2005/0270608 A1* | 12/2005 | Shiozawa | G03F 7/70083 359/15 |

FOREIGN PATENT DOCUMENTS

| | | |
|---|---|---|
| JP | 2003-59817 A | 2/2003 |
| TW | 200707541 A | 2/2007 |

* cited by examiner

*Primary Examiner* — Michelle M Iacoletti
(74) *Attorney, Agent, or Firm* — Canon U.S.A., Inc. IP Division

(57) ABSTRACT

An apparatus configured to expose a substrate to light includes an illumination optical system configured to illuminate a mask, a projection optical system configured to project a pattern of the mask onto the substrate, and a decentering mechanism configured to decenter at least one optical element of the illumination optical system with respect to an optical axis of the projection optical system, or to decenter at least one optical element of the projection optical system with respect to an optical axis of the illumination optical system, and rotational asymmetry distortion that occurs at a position defocused from a focus position of the projection optical system is changed by decentering the optical element by the decentering mechanism.

18 Claims, 12 Drawing Sheets

EXPOSURE APPARATUS AND ARTICLE MANUFACTURING METHOD

BACKGROUND OF THE INVENTION

Field of the Invention

The aspect of the embodiments relates to an exposure apparatus and an article manufacturing method.

Description of the Related Art

In a case where an element such as a semiconductor element and a liquid crystal display element is manufactured using a photolithographic technique, an exposure apparatus is used. Such an exposure apparatus causes a projection optical system to project a pattern of a mask onto a substrate, and transfers the pattern.

Illuminance uniformity on an illumination target surface such as a mask surface and a substrate surface is expected to be enhanced, and a light quantity gravity center (telecentricity) of angle distribution of illumination light for illuminating each point on the illumination target surface is expected to be perpendicular to the substrate to form a fine pattern on the substrate.

However, the telecentricity may be degraded. In such a case, a position at which an image is focused on the substrate surface shifts in a direction perpendicular to an optical axis when the substrate is exposed to light at a position displaced in an optical axis direction from an image surface (a focus position) of the projection optical system. Moreover, the telecentricity may differ at each position on the illumination target surface. In such a case, a distorted image is formed on the substrate surface.

Japanese Patent Application Laid-Open No. 2003-59817 discusses an exposure apparatus that corrects rotational symmetry distortion (distortion of an image) caused by degradation in telecentric property of illumination light with respect to a substrate even if a position of the substrate is displaced in a defocus direction. In the exposure apparatus discussed in Japanese Patent Application Laid-Open No. 2003-59817, information about telecentricity to be generated by an optical system is stored, and a lens is driven in an optical axis direction according to a defocus amount at a position at which the substrate is positioned, thereby exposing the substrate to light. This reduces the rotational symmetry distortion such as projection magnification.

An optical system aberration can occur due to manufacturing error in a lens surface shape, and thus rotational asymmetry distortion can occur at a defocus position. The exposure apparatus discussed in Japanese Patent Application Laid-Open No. 2003-59817 drives the lens in the optical axis direction to correct the rotational symmetry distortion. However, Japanese Patent Application Laid-Open No. 2003-59817 does not disclose a technique for correcting such rotational asymmetry distortion.

Moreover, in a case where a thick-film resist is applied to a substrate, and then the substrate is exposed to light, distortion at a position defocused in an optical axis direction from an image surface of a projection optical system is to be controlled in order to control a resist profile (a pattern shape). The substrate undergoes substrate processing steps including a prior exposure step. Since a pattern already formed on the substrate is distorted by such substrate processing steps, an exposure apparatus capable of overlaying a pattern on optional distortion and exposing the pattern to light is demanded.

SUMMARY OF THE INVENTION

According to an aspect of the embodiments, an apparatus configured to expose a substrate to light includes an illumination optical system configured to illuminate a mask, a projection optical system configured to project a pattern of the mask onto the substrate, and a decentering mechanism configured to decenter at least one optical element of the illumination optical system with respect to an optical axis of the projection optical system, or to decenter at least one optical element of the projection optical system with respect to an optical axis of the illumination optical system, and rotational asymmetry distortion that occurs at a position defocused from a focus position of the projection optical system is changed by decentering the optical element by the decentering mechanism.

Further features of the present disclosure will become apparent from the following description of exemplary embodiments with reference to the attached drawings.

DESCRIPTION OF THE EMBODIMENTS

Exemplary embodiments will be described in detail with reference to the drawings.

Figure 1:
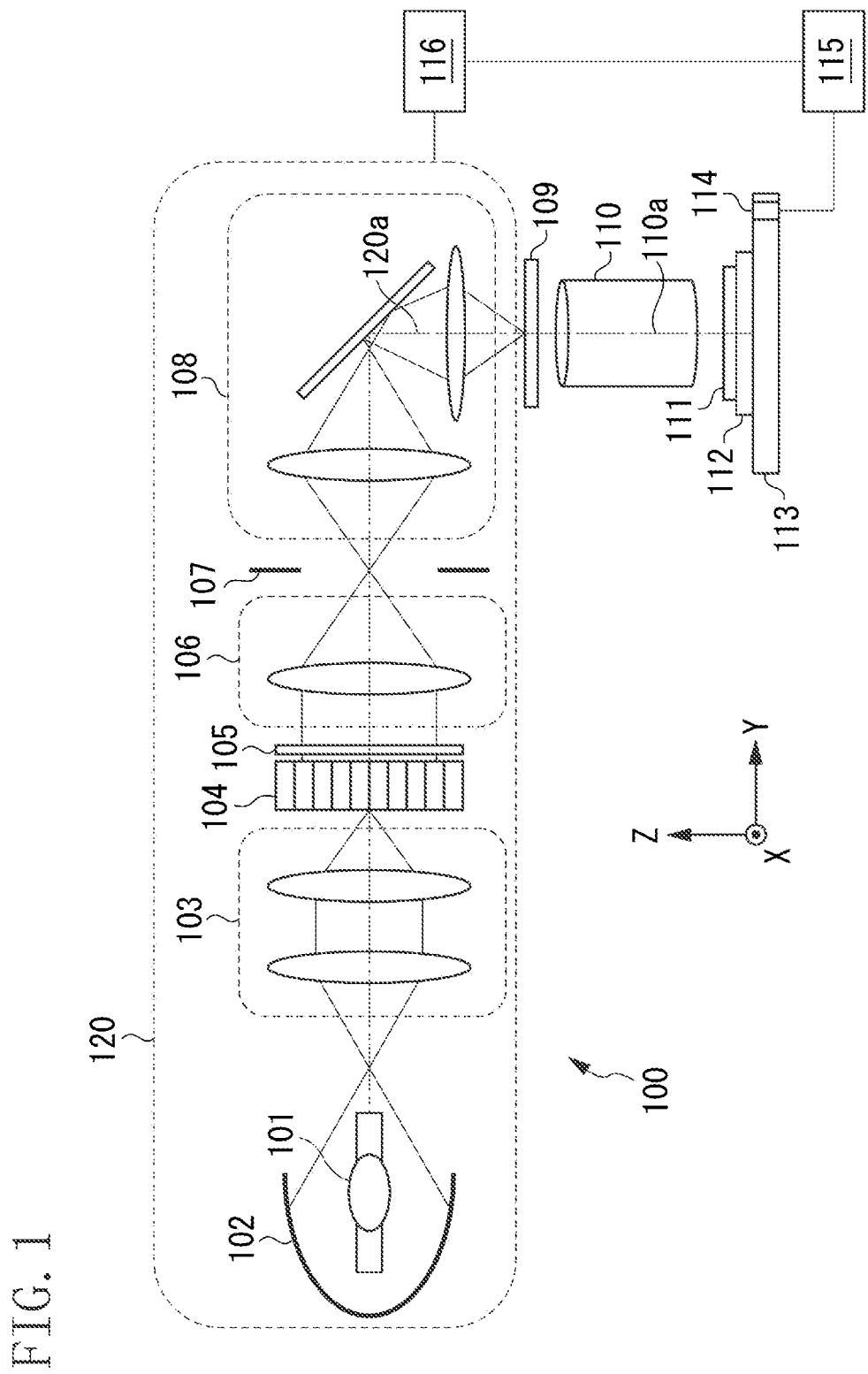
FIG. 1 is a schematic diagram illustrating an exposure apparatus according to a first exemplary embodiment.

A first exemplary embodiment is described. FIG. 1 is a schematic diagram illustrating an exposure apparatus 100. A unit including components from a light source 101 to a relay lens 108 is defined as an illumination optical system 120. The light source 101 includes a super-high pressure mercury lamp. An oval mirror 102 condenses light from the light source 101. The light source 101 is arranged near a first focal point of the oval mirror 102. The light reflected by the oval mirror 102 is guided to a relay optical system 103. The light transmitted through the relay optical system 103 is transmitted through an optical integrator 104, so that multiple secondary-light-sources are formed. Then, light flux cross section is formed in a desired light intensity shape by an aperture stop 105. Since the aperture stop 105 is a surface that undergoes Fourier transformation with an illumination target surface, a shape of the aperture stop 105 determines angular distribution of the illumination target surface. Accordingly, a field diaphragm 107 is irradiated in a substantially uniform manner with the light having desired angular distribution via a condenser lens 106. The light formed in an illumination area having a desired shape by the field diaphragm 107 illuminates a mask (reticle) 109 of an illumination target surface via the relay lens 108.

A drive mechanism 116 (a decentering mechanism) includes an actuator that drives (decenters) the illumination optical system 120 in a direction perpendicular to an optical axis 120a of the illumination optical system 120.

A projection optical system 110 projects a pattern of the illuminated mask 109 onto a substrate 111 held by a substrate holding chuck 112 on a substrate stage 113 for positioning the substrate, and exposes the substrate 111 to light.

On the substrate stage 113, a sensor 114 for measuring telecentricity of light to which the substrate 111 is exposed is arranged. The sensor 114 includes a light-shielding plate with a pinhole or a slit, and a photoelectric transducer such as a charge-coupled device (CCD). The photoelectric transducer receives light that has passed through a pinhole or a slit, and converts such light into electric signals. The sensor 114 is moved into a projection area of the projection optical system 110 by the substrate stage 113, thereby measuring angular distribution of light to be incident at each position on a plane perpendicular to an optical axis.

A control unit 115 acquires information about the angular distribution measured by the sensor 114 to determine a light quantity gravity center (telecentricity). The telecentricity represents a degree of parallelization of the light quantity gravity center at each position on an image surface with respect to an optical axis of the projection optical system. The telecentricity is expressed by an inclination angle or a displacement amount of an image when a substrate is defocused by 1 μm. Then, the control unit 115 calculates, based on the light quantity gravity center at each position, distortion at a position displaced in a direction (in a defocus direction) parallel to an optical axis 110a of the projection optical system 110 from the image surface (a focus position) of the projection optical system 110. The distortion at such a position is also referred to as defocus distortion. The control unit 115 calculates, based on the calculated distortion, a driving amount in a direction perpendicular to an optical axis of the illumination optical system 120, and controls a drive mechanism 116 to drive the illumination optical system 120 by the calculated driving amount.

Figure 2:
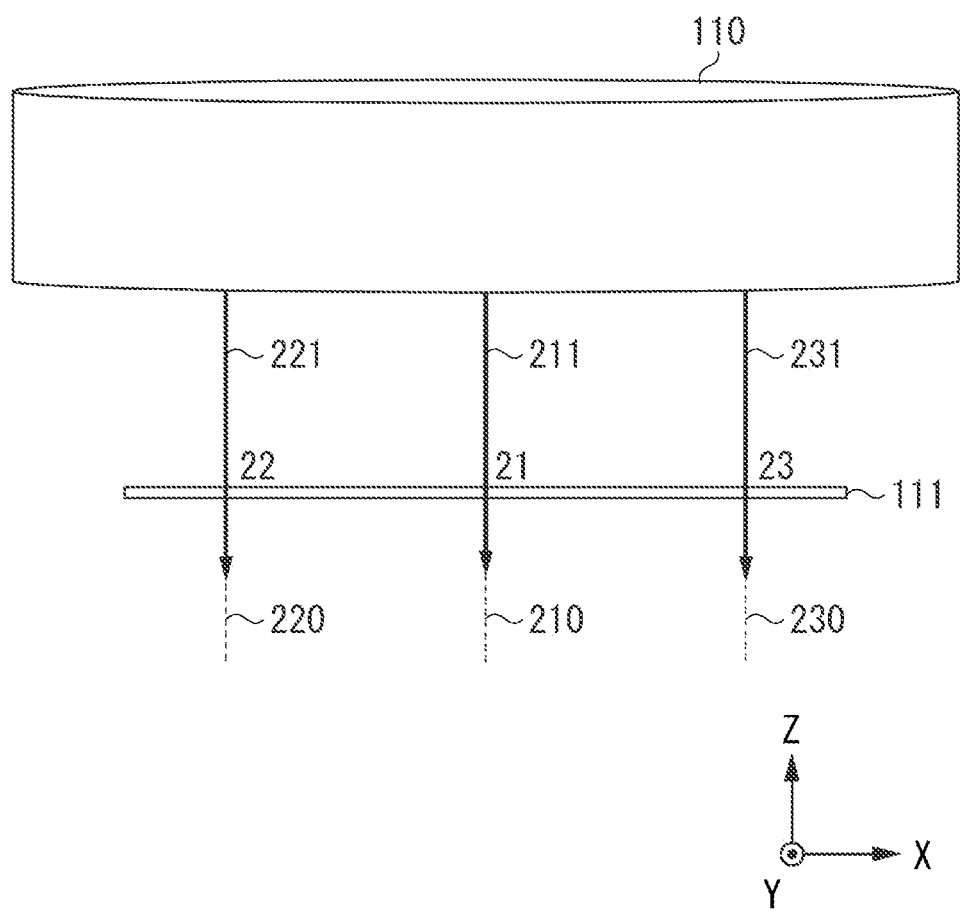
FIG. 2 is a diagram illustrating telecentricity.

FIG. 2 is a diagram illustrating telecentricity of exposure light on the substrate 111. An on-axis image height 21, an off-axis image height 22, and an off-axis image height 23 are provided at respective positions on the substrate 111. The on-axis image height 21 is provided at a position on an optical axis of the projection optical system 110. The off-axis image height 22 is provided at a position on a negative side in an X direction from the optical axis of the projection optical system 110, whereas the off-axis image height 23 is provided at a position on a positive side in the X direction from the optical axis of the projection optical system 110. An image height represents a distance from the optical axis of the projection optical system 110. An axis 210 is perpendicular to a surface of the substrate 111 at the on-axis image height 21. An axis 220 is perpendicular to the surface of the substrate 111 at the off-axis image height 22, and an axis 230 is perpendicular to the surface of the substrate 111 at the off-axis image height 23. A light ray 211 has a light quantity gravity center of exposure light at the on-axis image height 21. A light ray 221 has a light quantity gravity center of exposure light at the off-axis image height 22, and a light ray 231 has a light quantity gravity center of exposure light at the off-axis image height 23.

The light ray 211 at the on-axis image height 21 is parallel to the axis 210, and is telecentric. In other words, this indicates that an image is not displaced at a defocused position due to telecentricity. Similarly, the light ray 221 at the off-axis image height 22 is parallel to the axis 220, and the light ray 231 at the off-axis image height 23 is parallel to the axis 230.

Figure 3:
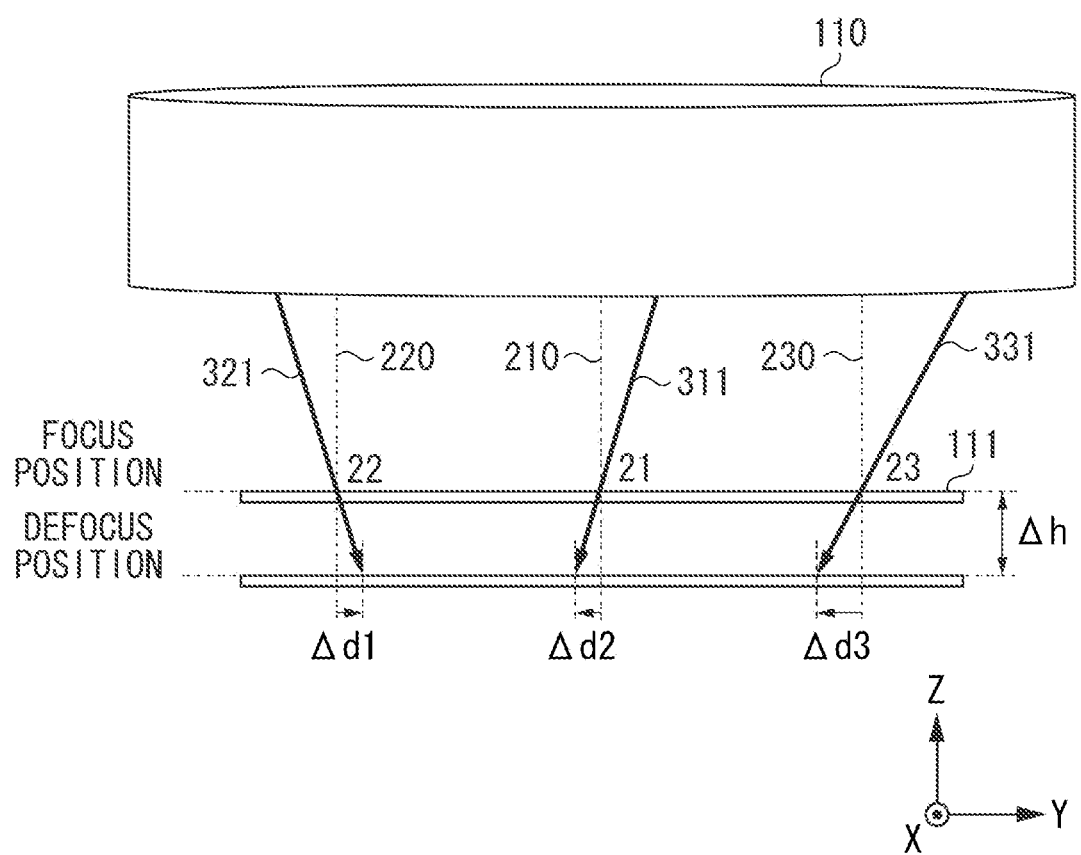
FIG. 3 is a diagram illustrating a state in which there is a telecentricity error.

FIG. 3 is a diagram illustrating a state that is not telecentric. In this state, a light ray 311 has a light quantity gravity center of exposure light at on-axis image height 21, a light ray 321 has a light quantity gravity center of exposure light at the off-axis image height 22, and a light ray 331 has a light quantity gravity center of exposure light at the off-axis image height 23.

The light ray 311 at the on-axis image height 21 is not parallel to the axis 210, or is not telecentric (a telecentricity error is present). In other words, this indicates that an image is displaced at a defocused position due to telecentricity. Similarly, the light ray 321 at the off-axis image height 22 is not parallel to the axis 220, or is not telecentric. The light ray 331 at the off-axis image height 23 is not parallel to the axis 230, or is not telecentric.

A position of an image to be formed on the substrate 111 depends on an angle of telecentricity of exposure light and a displacement amount (a defocus amount) from a best focus position of an exposed surface of the substrate 111. In a case where the projection optical system may have no distortion aberration at a best focus position, a position, at which an image is to be formed when an exposed surface of the substrate 111 is at the best focus position, is not displaced even if the projection optical system is not telocentric. However, if the substrate 111 is exposed to light at a position to which the substrate 111 has been vertically moved by a defocus amount Δh, a position at which an image is to be formed on the substrate 111 is displaced by depending on a telecentricity angle and the defocus amount Δh. At this time, displacement amounts (errors) Δd1, Δd2, and Δd3 are generated. The displacement amount Δd1 is an amount by which a position of an image to be formed by the light ray 321 is displaced. The displacement amount Δd2 is an amount by which a position of an image to be formed by the light ray 311 is displaced, and the displacement amount Δd3 is an amount by which a position of an image to be formed by the light ray 331 is displaced.

If a thick-film resist is applied to a substrate and then the substrate is exposed to light, distortion at a position defocused in an optical axis direction from an image surface of the projection optical system is to be controlled in order to control a resist profile (a pattern shape).

If telecentricity varies according to an image height, a displacement amount of a position of an image at the time of defocus varies on an image-height basis. The use of such a characteristic enables, for example, non-linear distortion to be adjusted with respect to each position in an image to be formed on the substrate.

To be described below is an ideal case in which the projection optical system 110 and the illumination optical system 120 do not have errors such as manufacturing errors.

Figure 4A:
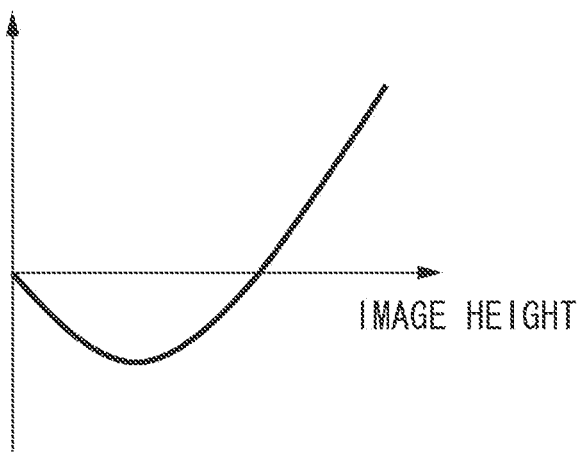
FIGS. 4A and 4B are diagrams illustrating image height dependence of the telecentricity.

FIG. 4A is a diagram illustrating image height dependence of telecentricity on the side of the mask 109 of the projection optical system 110. An origin position is an on-axis image height. FIG. 4A illustrates, as one example, a state in which telecentricity depends on an image height and is changed to a tertiary component.

Figure 4B:
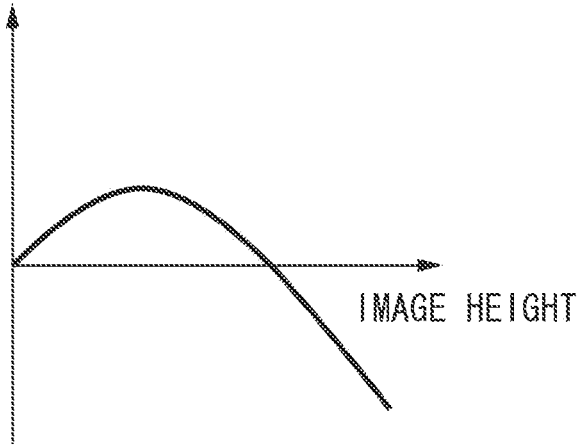

FIG. 4B is a diagram illustrating image height dependence of telecentricity on the side of the mask 109 of the illumination optical system 120. An origin position is an on-axis image height. FIG. 4B illustrates, as one example, a state in which telecentricity depends on an image height and is changed to a tertiary component in such a way that a telecentricity error of the projection optical system 110 is reduced.

The telecentricity of the entire exposure apparatus 100, that is, telecentricity of exposure light to which the substrate 111 is exposed is the sum of telecentricity of the projection optical system 110 and the illumination optical system 120. Accordingly, in a state in which an optical axis of the illumination optical system 120 and an optical axis of the projection optical system 110 are not displaced, a characteristic of telecentricity with respect to an image height of the illumination optical system 120 and a characteristic of telecentricity with respect to an image height of the projection optical system 110 cancel out each other.

Therefore, an image-height-dependent telecentricity error does not occur.

Figure 5:
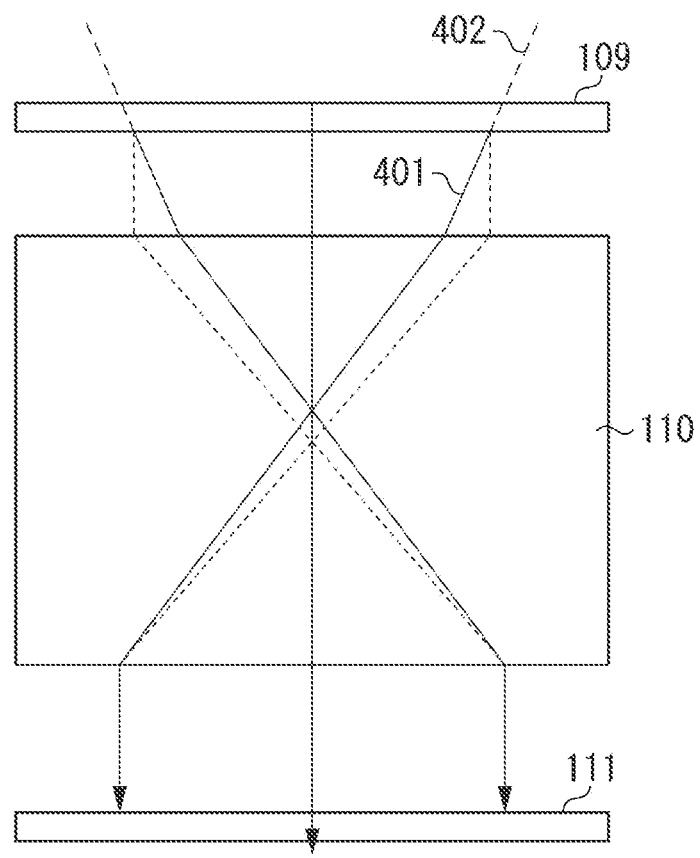
FIG. 5 is a diagram illustrating telecentricity of the exposure apparatus.

FIG. 5 is a diagram illustrating telecentricity of the exposure apparatus 100. Telecentricity 402 on the side of the mask 109 of the illumination optical system 120 is arranged to match telecentricity 401 on the side of the mask 109 of the projection optical system 110 in such a way that a telecentricity error on the substrate 111 is eliminated.

However, an error in telecentricity of the exposure apparatus 100 can occur due to a material or a surface shape of a lens of the projection optical system 110 or the illumination optical system 120, a manufacturing error in a lens holder, or an error in a position or angle of a lens. Consequently, rotational asymmetry distortion occurs at a defocus position.

In the present exemplary embodiment, the illumination optical system 120 is decentered so as to be displaced in a direction perpendicular to the optical axis of the projection optical system 110, so that rotational asymmetry distortion to occur at a defocus position is corrected.

Figure 6:
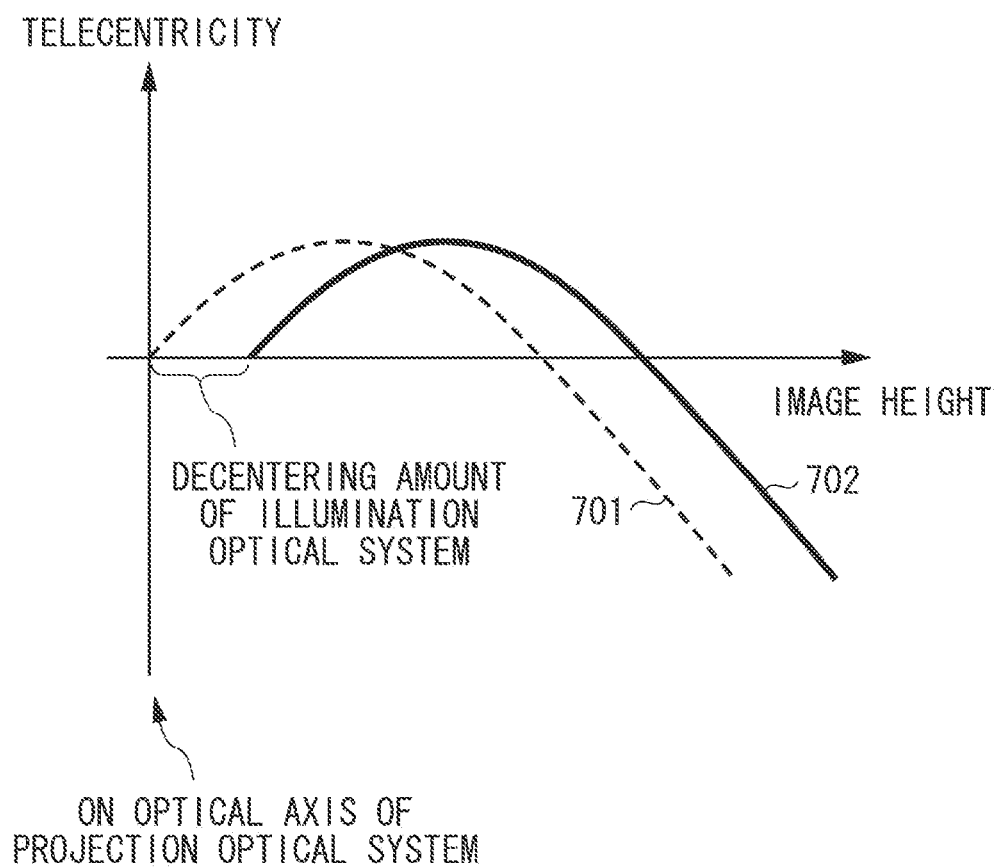
FIG. 6 is a diagram illustrating a telecentricity characteristic provided by decentering an illumination optical system.

FIG. 6 is a diagram illustrating image height dependence of telecentricity of the illumination optical system 120 before and after the illumination optical system 120 is decentered. A broken line indicates a telecentricity characteristic 701 before the illumination optical system 120 is decentered, whereas a solid line indicates a telecentricity characteristic 702 after the illumination optical system 120 is decentered. In a case where the illumination optical system 120 is decentered in a direction perpendicular to an optical axis of the projection optical system 110, a telecentricity characteristic of the illumination optical system 120 shifts in an image height direction.

Figure 7:
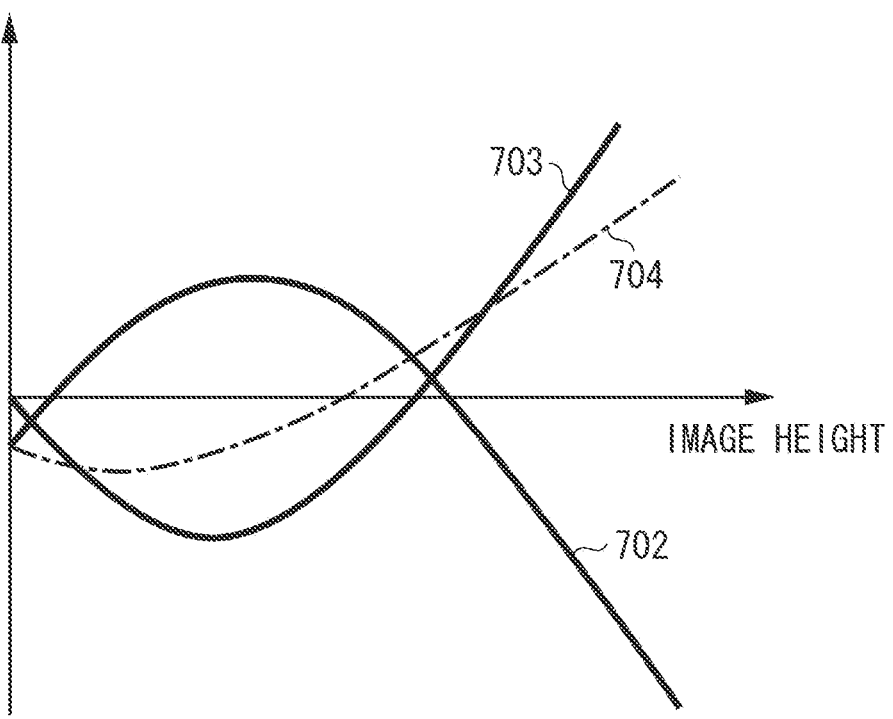
FIG. 7 is a diagram illustrating a telecentricity error of the exposure apparatus after the illumination optical system is decentered.

FIG. 7 is a diagram illustrating image height dependence of telecentricity of the exposure apparatus 100 when the illumination optical system 120 is decentered in a direction perpendicular to an optical axis of the projection optical system 110. A solid line indicates a telecentricity characteristic 703 of the projection optical system 110. The exposure apparatus 100 has a telecentricity characteristic 704 that is the sum of the shifted telecentricity characteristic 702 of the illumination optical system 120 and the telecentricity characteristic 703 of the projection optical system 110.

In the present exemplary embodiment, each of the telecentricity characteristic 703 of the projection optical system 110 and the telecentricity characteristic 702 of the illumination optical system 120 depends on an image height and is a tertiary component. For this reason, the exposure apparatus 100 has the telecentricity characteristic 704 which depends on an image height and is a secondary component corresponding to a difference between the telecentricity characteristic 703 and the telecentricity characteristic 702. The telecentricity characteristic 704 can be expressed as mathematical formulas below.

$\Delta X = A(dX)^2 + B(dX) + C$, where $\Delta X$ is an X component of the telecentricity characteristic 704 when the illumination optical system 120 is decentered by an amount of distance $dX$ in an X direction perpendicular to an optical axis of the projection optical system 110, A is a secondary coefficient, B is a primary coefficient, and C is a zero-order coefficient. Moreover, $\Delta Y = A'(dX)^2 + B'(dX) + C'$, where $\Delta Y$ is a Y component of the telecentricity characteristic 704 when the illumination optical system 120 is decentered by an amount of distance $dY$ in a Y direction perpendicular to an optical axis of the projection optical system 110, A' is a secondary coefficient, B' is a primary coefficient, and C' is a zero-order coefficient.

In a case where the substrate 111 is defocused and exposed to the light, a telecentricity characteristic is similar to a characteristic of displacement of a position of an image to be formed on the substrate 111. For this reason, the decentering of the illumination optical system 120 can generate an image-height-dependent positional error in a secondary component in an image to be formed on the substrate 111. In other words, the decentering of the illumination optical system 120 can generate rotational asymmetry distortion.

Figure 8:
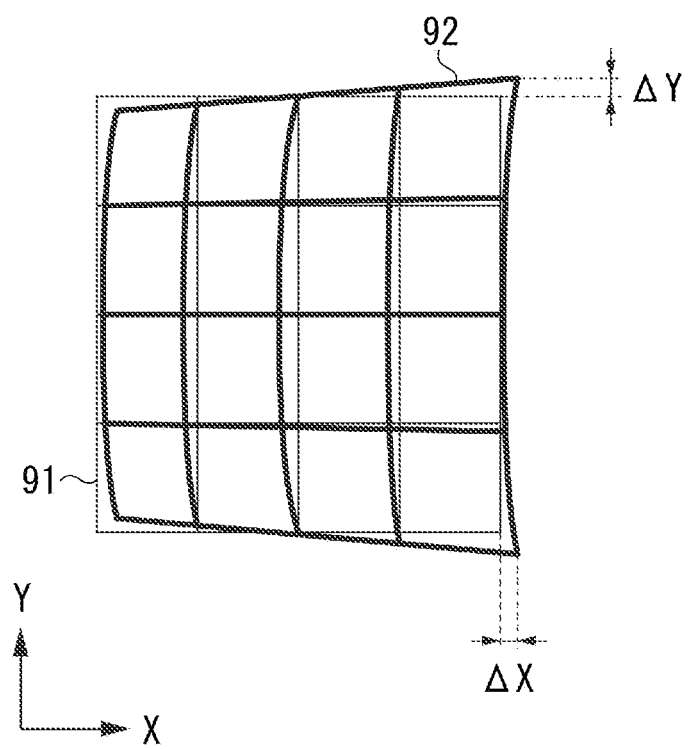
FIG. 8 is a diagram illustrating rotational asymmetry distortion.

FIG. 8 is a diagram illustrating rotational asymmetry distortion of an image to be formed on the substrate 111 at a defocus position. Solid lines 91 in a shape of a tetragonal lattice indicate an ideal shape having no distortion. Thick lines 92 indicate a shape of rotational asymmetry distortion when the illumination optical system 120 is decentered in an X direction perpendicular to an optical axis of the illumination optical system 120.

As for the X direction in which the illumination optical system 120 is decentered, an X error $\Delta X$ in a secondary component can be generated by dependence on coordinates in the X direction. Moreover, as for a Y direction perpendicular to the X direction, a Y error $\Delta Y$ in a secondary component can be generated by dependence on coordinates in the Y direction.

Accordingly, the illumination optical system 120 is decentered in such a way that an optical axis of the illumination optical system 120 is displaced in a direction perpendicular to an optical axis of the projection optical system 110, so that rotational asymmetry distortion can be changed. For this reason, the rotational asymmetry distortion at a defocus position caused by the illumination optical system 120 or the projection optical system 110 can be adjusted so as to be reduced. Therefore, even if the substrate 111 is defocused and exposed to the light, a pattern having little distortion can be formed on the substrate 111.

Figure 9:
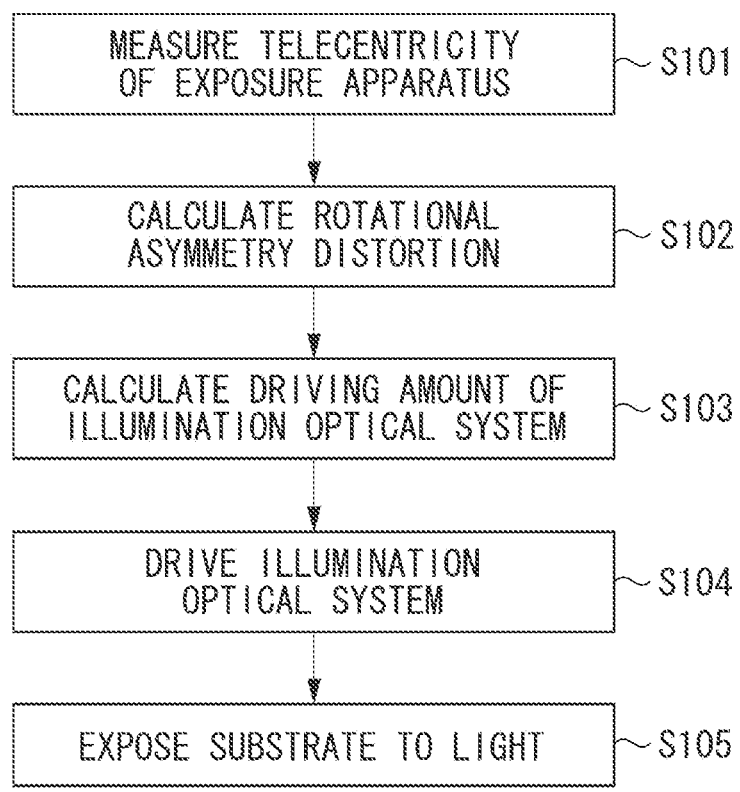
FIG. 9 is a flowchart illustrating a control operation according to the first exemplary embodiment.

A control operation according to the present exemplary embodiment is described with reference to a flowchart illustrated in FIG. 9. In step S101, the control unit 115 uses the sensor 114 mounted on the substrate stage 113 to measure telecentricity of the exposure apparatus 100 before a substrate is exposed to light. At this time, the sensor 114 measures a light quantity gravity center at an on-axis image height and each of a plurality of off-axis image heights. In step S102, the control unit 115 acquires the measurement data acquired by the sensor 114, and calculates a rotational asymmetry distortion component D1 at a defocus position from the light quantity gravity center at each image height.

A change amount (sensitivity) E1 is an amount of change in rotational asymmetry distortion at a defocus position with respect to a decentering amount of the illumination optical system 120 when the illumination optical system 120 is decentered with respect to the projection optical system 110. In step S103, the control unit 115 calculates a driving amount F1 from the calculated distortion component D1 and the sensitivity E1 according to a formula of F1=D1/E1. The driving amount F1 is a necessary amount to decenter the illumination optical system 120.

In step S104, the control unit 115 controls the drive mechanism 116 to drive the illumination optical system 120 by the calculated driving amount F1 in such a way that the illumination optical system 120 is decentered by an amount corresponding to the calculated driving amount F1 in a direction perpendicular to an optical axis of the illumination optical system 120. In this way, the rotational asymmetry distortion at the defocus position of the exposure apparatus 100 is corrected. Subsequently, in step S105, at the defocus position, a mask pattern is projected onto the substrate, and the substrate is exposed to light in a state in which the rotational asymmetry distortion is reduced.

The present exemplary embodiment has been described using a case in which image height dependence of telecentricity of each of the projection optical system 110 and the illumination optical system 120 is a tertiary component. However, the image height dependence is not limited to a tertiary component. For example, if image height dependence of telecentricity of each of the projection optical system 110 and the illumination optical system 120 is a secondary component, a primary component of defocus distortion can be adjusted. Moreover, if a higher order component is provided, higher-order defocus distortion can be adjusted.

The optical axis 110a of the projection optical system 110 may be decentered with respect to the optical axis 120a of the illumination optical system 120. In other words, an optical axis of an illumination optical system and an optical axis of a projection optical system are relatively decentered, so that rotational asymmetry distortion can be changed.

Figure 10:
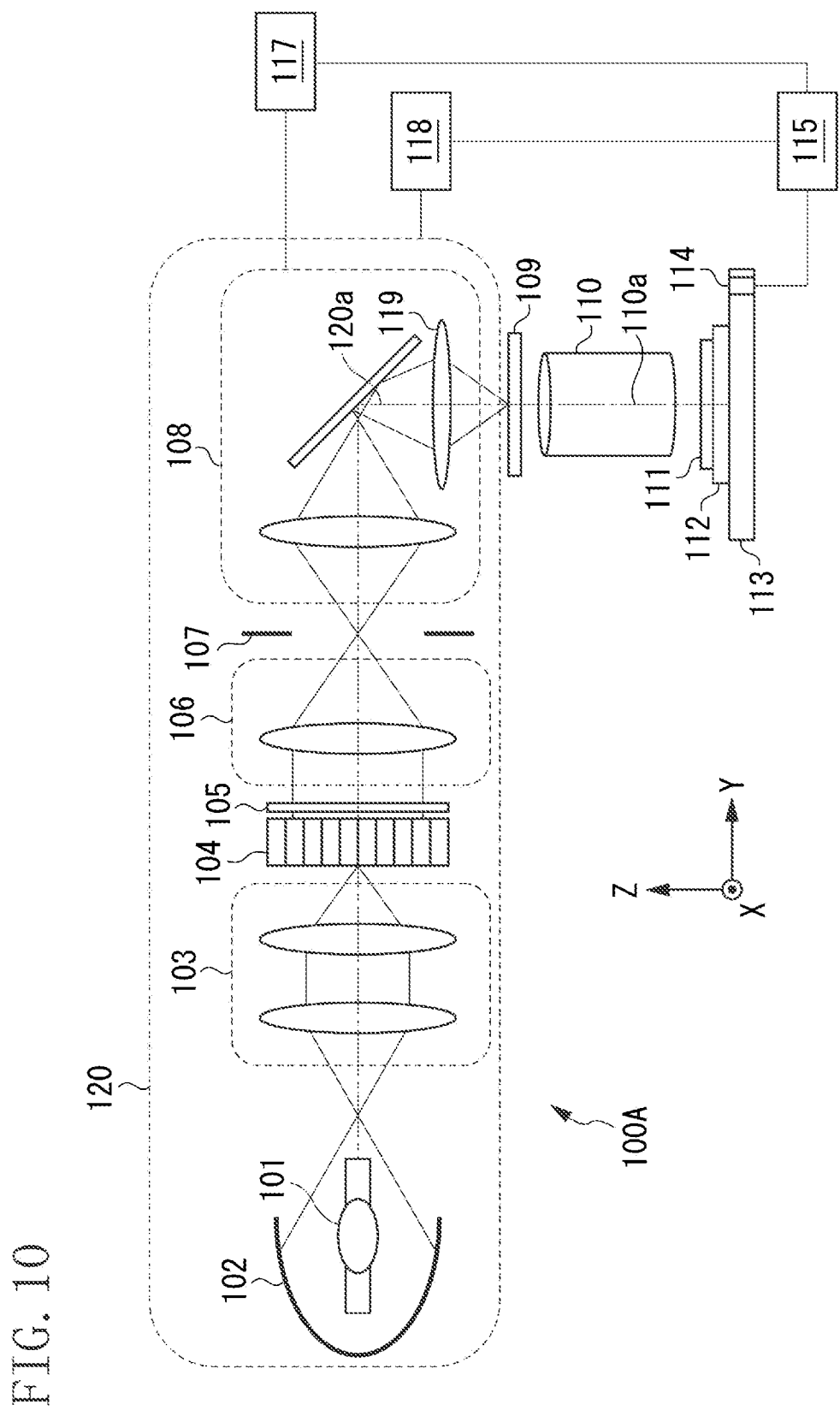
FIG. 10 is a schematic diagram illustrating an exposure apparatus according to a second exemplary embodiment.

A second exemplary embodiment is described. FIG. 10 is a schematic diagram illustrating an exposure apparatus according to the present exemplary embodiment. A description of configurations similar to those of the first exemplary embodiment is omitted.

An exposure apparatus 100A of the present exemplary embodiment includes a drive mechanism 117 that drives a relay lens 108 (an optical system) in a direction perpendicular to an optical axis 120a. A control unit 115 controls the drive mechanism 117 based on a determined driving amount. Moreover, the exposure apparatus 100A includes a drive mechanism 118 that drives a lens 119 (an optical element) in a direction perpendicular to the optical axis 120a. The lens 119 is one of lenses in the relay lens 108. The control unit 115 controls the drive mechanism 118 based on a determined driving amount.

In the present exemplary embodiment, the relay lens 108 or the lens 119, which is one of lenses in the relay lens 108, is decentered with respect to an optical axis 110a of a projection optical system 110. This changes rotational asymmetry distortion that occurs at a position defocused from a focus position of the projection optical system 110. A change in a telecentricity characteristic by the decentering of the relay lens 108 or the lens 119, that is, a change in the rotational asymmetry distortion, is similar to that of the first exemplary embodiment. Thus, in a case where a substrate 111 is defocused and exposed to light, an image-height-dependent positional error in a secondary component can be generated.

Figure 11:
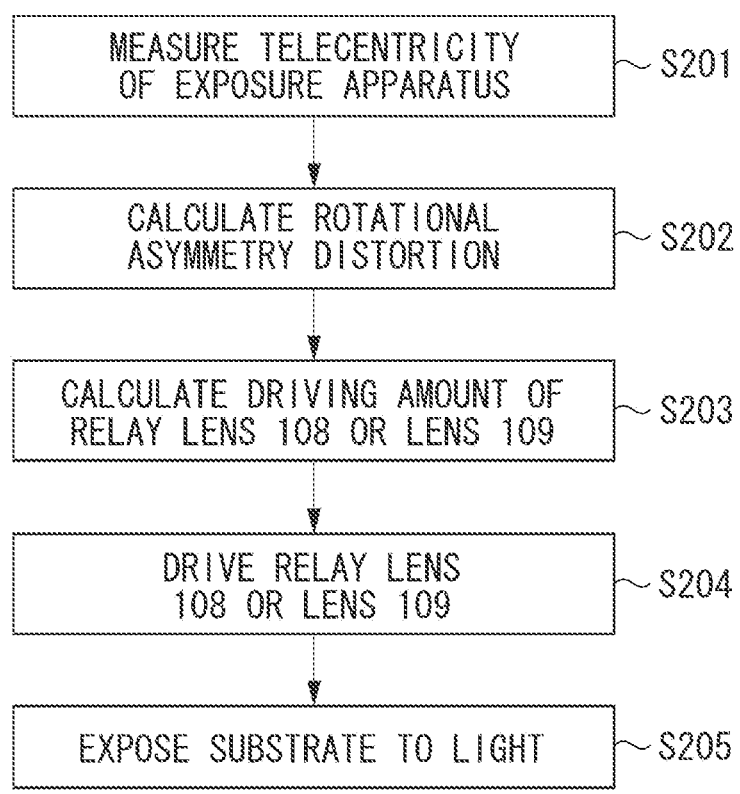
FIG. 11 is a flowchart illustrating a control operation according to the second exemplary embodiment.

A control operation according to the present exemplary embodiment is described with reference to a flowchart illustrated in FIG. 11. In step S201, the control unit 115 uses a sensor 114 mounted on a substrate stage 113 to measure telecentricity of the exposure apparatus 100A before the substrate is exposed to light. At this time, the sensor 114 measures a light quantity gravity center at an on-axis image height and each of a plurality of off-axis image heights. In step S202, the control unit 115 acquires the measurement data acquired by the sensor 114, and calculates a rotational asymmetry distortion component D2 at a defocus position from the light quantity gravity center of each image height.

A change amount (sensitivity) E2 is an amount of change in rotational asymmetry distortion at a defocus position with respect to a decentering amount of the relay lens 108 or the lens 119 when the relay lens 108 or the lens 119 is decentered with respect to the projection optical system 110. In step S203, the control unit 115 calculates a driving amount F2 from the calculated distortion component D2 and the sensitivity E2 according to a formula of F2=D2/E2. The driving amount F2 is a necessary amount to decenter the relay lens 108 or the lens 119.

In step S204, the control unit 115 controls a drive mechanism 117 or 118 to drive the relay lens 108 or the lens 119 by the calculated driving amount F2 in such a way that the relay lens 108 or the lens 119 is decentered by an amount corresponding to the calculated driving amount F2 in a direction perpendicular to an optical axis. In this way, the rotational asymmetry distortion at the defocus position of the exposure apparatus 100A is corrected. Subsequently, in step S205, at the defocus position, a mask pattern is projected onto the substrate, and the substrate is exposed to light in a state in which the rotational asymmetry distortion is reduced.

The present exemplary embodiment has been described using a case in which the relay lens 108 or the lens 119 which is one of lenses in the relay lens 108 is decentered. However, the present exemplary embodiment is not limited to such a case. A lens on the side of a field diaphragm 107 in the relay lens 108 can be decentered, or a plurality of lenses can be decentered. Moreover, one of lenses (optical elements) in the projection optical system 110, or a lens group can be decentered with respect to the optical axis 120a of the illumination optical system 120.

According to the present exemplary embodiment, the use of a simple drive mechanism that decenters one of lenses can change rotational asymmetry distortion that occurs at a position defocused from a focus position of a projection optical system without having to drive the entire projection optical system.

A third exemplary embodiment is described. In a lithography step using an exposure apparatus, overlay exposure is generally performed on a pattern that is formed on a substrate by a prior step. In such a case, if an exposure apparatus that has performed exposure processing in the prior step differs from an exposure apparatus to be used when overlay exposure is performed, a difference in distortion components between the apparatuses as an optical error of the exposure apparatuses becomes an overlay error. Consequently, such an optical error affects overlay accuracy. Since a difference in distortion components between the apparatuses is determined by, for example, an optical performance error of each exposure apparatus, there are not only a rotational symmetric component such as a magnification error but also a rotational asymmetry distortion component to be generated by influence of high order aberration.

In the present exemplary embodiment, a distortion adjusting method is described. By the distortion adjusting method, distortion is to be adjusted in a case where overlay exposure is performed on a pattern that is formed on a substrate by a prior step. An exposure apparatus has configurations that are substantially the same as those of the first exemplary embodiment.

Figure 12:
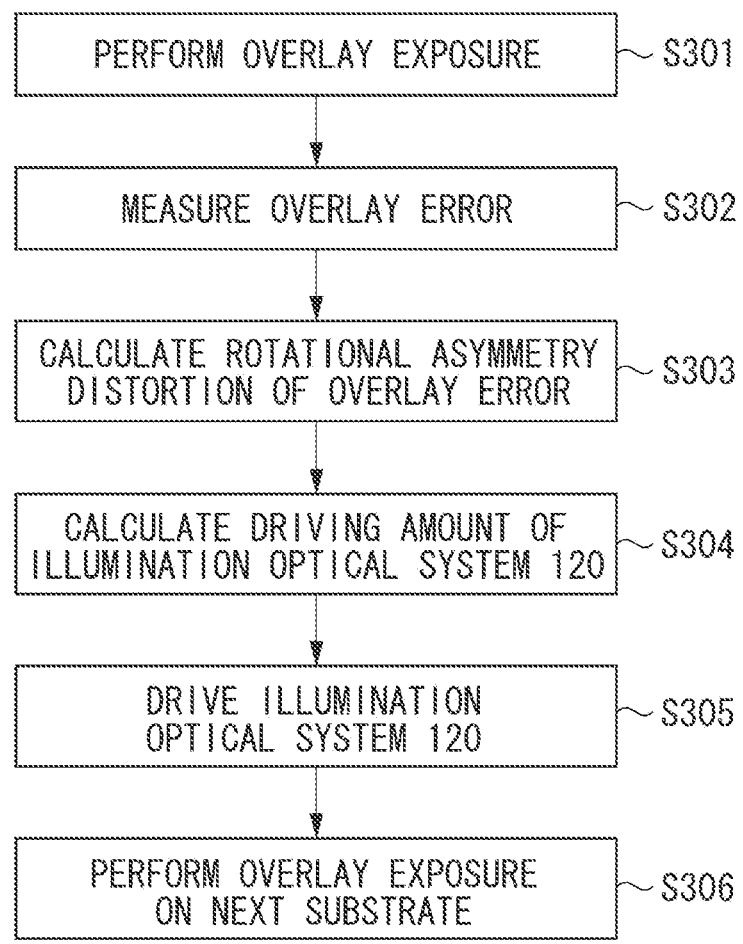
FIG. 12 is a flowchart illustrating a control operation according to a third exemplary embodiment.

A control operation according to the present exemplary embodiment is described with reference to a flowchart illustrated in FIG. 12.

In step S301, the exposure apparatus performs overlay exposure, by which a mask pattern is overlaid on a pattern formed on a substrate in a prior step. Next, in step S302, after the pattern is formed on the substrate by a process such as a development process, an overlay measurement device (a measurement unit) measures an amount of positional displacement of an overlay measurement mark within a shot. The overlay measurement can be performed within the exposure apparatus or by using an external measurement device.

In step S303, the control unit 115 acquires information about an overlay error based on the measured amount (a measurement result) of positional displacement of the overlay measurement mark, and calculates a rotational asymmetry distortion component D3 from the acquired information about the overlay error. The calculated distortion component is set to a target shape of the distortion.

A change amount (sensitivity) E3 is an amount of change in rotational asymmetry distortion at a defocus position with respect to a decentering amount of an illumination optical system 120 when the illumination optical system 120 is decentered with respect to an optical axis of a projection optical system 110.

Subsequently, in a case where a thick-film resist is applied to the substrate and the resultant substrate is exposed to light, a distortion amount at a substrate surface position can be set. In step S304, the control unit 115 calculates a driving amount F3 from the calculated distortion component D3 (the target shape), the sensitivity E3, and a defocus amount G at the substrate surface position according to a formula of F3=D3×G/E3. The driving amount F3 is a necessary amount to decenter the illumination optical system 120.

In step S305, the control unit 115 controls a drive mechanism 116 to drive the illumination optical system 120 by the calculated driving amount F3 in such a way that the illumination optical system 120 is decentered by an amount corresponding to the calculated driving amount F3 in a direction perpendicular to an optical axis. In this way, after the rotational asymmetry distortion at the defocus position of the exposure apparatus 100 is adjusted, the rotational asymmetry distortion is reduced (corrected) at the defocus position. In this state, in step S306, a mask pattern is projected onto a next substrate on which a thick-film resist has been applied, and the next substrate is exposed to light.

The present exemplary embodiment has been described using a case in which the illumination optical system 120 is decentered. However, the present exemplary embodiment is not limited thereto. Similar to the second exemplary embodiment, one of lenses in a relay lens 108 can be decentered, or a lens of a projection optical system can be decentered.

According to the present exemplary embodiment, in a case where overlay exposure is performed, an overlay error can be reduced even though a pattern already formed on a substrate has a rotational asymmetry distortion component.

(Article Manufacturing Method)

A fourth exemplary embodiment is described. A method for manufacturing an article (e.g., a semiconductor integrated circuit (IC) element, a liquid crystal display element, a color filter, and a micro electro mechanical system (MEMS)) by using the above-described exposure apparatus is described below. An article is manufactured by undergoing an exposure step, a development step, and another known process step. In the exposure step, the above-described exposure apparatus is used to expose, to light, a substrate (e.g., a wafer, a glass substrate) on which a photosensitive agent has been applied. The substrate (the photosensitive agent) is developed in the development step, and the developed substrate is processed in the known process step. The known process step includes etching, resist peeling, dicing, bonding, and packaging. According to the present manufacturing method, an article having higher quality than that manufactured by a conventional method can be manufactured.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-146780, filed Jul. 28, 2017, which is hereby incorporated by reference herein in its entirety.

What is claimed is:

1. An apparatus configured to expose a substrate to light, the apparatus comprising:
    an illumination optical system configured to illuminate a mask;
    a projection optical system configured to project a pattern of the mask onto the substrate; and
    a driving mechanism configured to drive and decenter at least one optical element of the illumination optical system with respect to an optical axis of the projection optical system, or to drive and decenter at least one optical element of the projection optical system with respect to an optical axis of the illumination optical system,
    wherein the driving mechanism is configured to drive and decenter the optical element according to a defocus amount of a position defocused from a focus position of the projection optical system to change rotational asymmetry distortion that occurs at the position defocused from the focus position.

2. The apparatus according to claim 1, wherein telecentricity with respect to a distance from the optical axis of the illumination optical system is shifted and the rotational asymmetry distortion is changed, by decentering the optical element of the illumination optical system with respect to the optical axis of the projection optical system.

3. The apparatus according to claim 1,
    wherein telecentricity with respect to a distance from the optical axis of the illumination optical system varies as a third power of the distance,
    wherein telecentricity with respect to a distance from the optical axis of the projection optical system varies as a third power of the distance, and
    wherein the rotational asymmetry distortion as a positional error of a second power of the distance is changed by decentering the optical element.

4. The apparatus according to claim 1, wherein, in a state in which the optical axis of the illumination optical system and the optical axis of the projection optical system are not displaced, telecentricity with respect to a distance from the optical axis of the illumination optical system and telecentricity with respect to a distance from the optical axis of the projection optical system cancel out each other.

5. The apparatus according to claim 1, further comprising:
a control unit configured to control the driving mechanism; and
a measurement unit configured to measure the rotational asymmetry distortion,
wherein the control unit controls, based on a result of measurement of the rotational asymmetry distortion, the driving mechanism to drive and decenter the optical element in such a way that the measured rotational asymmetry distortion is corrected.

6. The apparatus according to claim 1, further comprising a control unit configured to control the driving mechanism,
wherein the control unit acquires information about a defocus amount when the substrate is exposed to light and information about a target shape of the rotational asymmetry distortion when the substrate is exposed to light, and calculates the decentering amount of the optical element based on the defocus amount and the target shape.

7. The apparatus according to claim 1, wherein the rotational asymmetry distortion is changed by relatively decentering the optical axis of the illumination optical system and the optical axis of the projection optical system.

8. A method for manufacturing an article from a substrate, the method comprising:
exposing the substrate to light by using an apparatus; and
developing the substrate exposed to light,
wherein the article is obtained from the developed substrate,
wherein the apparatus including:
an illumination optical system configured to illuminate a mask;
a projection optical system configured to project a pattern of the mask onto the substrate; and
a driving mechanism configured to drive and decenter at least one optical element of the illumination optical system with respect to an optical axis of the projection optical system, or to drive and decenter at least one optical element of the projection optical system with respect to an optical axis of the illumination optical system, and
wherein the driving mechanism is configured to drive and decenter the optical element according to a defocus amount of a position defocused from a focus position of the projection optical system to change rotational asymmetry distortion that occurs at the position defocused from the focus position.

9. The method according to claim 8, wherein telecentricity with respect to a distance from the optical axis of the illumination optical system is shifted and the rotational asymmetry distortion is changed, by decentering the optical element of the illumination optical system with respect to the optical axis of the projection optical system.

10. The method according to claim 8,
wherein telecentricity with respect to a distance from the optical axis of the illumination optical system varies as a third power of the distance,
wherein telecentricity with respect to a distance from the optical axis of the projection optical system varies as a third power of the distance, and
wherein the rotational asymmetry distortion as a positional error of a second power of the distance is changed by decentering the optical element.

11. The method according to claim 8, wherein, in a state in which the optical axis of the illumination optical system and the optical axis of the projection optical system are not displaced, telecentricity with respect to a distance from the optical axis of the illumination optical system and telecentricity with respect to a distance from the optical axis of the projection optical system cancel out each other.

12. The method according to claim 8, further comprising:
controlling the driving mechanism; and
measuring the rotational asymmetry distortion,
wherein the controlling controls, based on a result of measurement of the rotational asymmetry distortion, the driving mechanism to drive and decenter the optical element in such a way that the measured rotational asymmetry distortion is corrected.

13. The method according to claim 8, further comprising:
controlling the driving mechanism;
acquiring information about a defocus amount when the substrate is exposed to light and information about a target shape of the rotational asymmetry distortion when the substrate is exposed to light; and
calculating a decentering amount of the optical element based on the defocus amount and the target shape.

14. The method according to claim 8, wherein the rotational asymmetry distortion is changed by relatively decentering the optical axis of the illumination optical system and the optical axis of the projection optical system.

15. An apparatus configured to expose a substrate to light, the apparatus comprising:
an illumination optical system configured to illuminate a mask;
a projection optical system configured to project a pattern of the mask onto the substrate;
a driving mechanism configured to drive and decenter at least one optical element of the illumination optical system with respect to an optical axis of the projection optical system, or to drive and decenter at least one optical element of the projection optical system with respect to an optical axis of the illumination optical system; and
a control unit configured to acquire information about a defocus amount when the substrate is exposed to light and information about a target shape of the rotational asymmetry distortion when the substrate is exposed to light, calculates a decentering amount of the optical element based on the defocus amount and the target shape, and control the driving mechanism by using the calculated decentering amount,
wherein rotational asymmetry distortion that occurs at a position defocused from a focus position of the projection optical system is changed by decentering the optical element by the driving mechanism.

16. An apparatus configured to expose a substrate to light, the apparatus comprising:
an illumination optical system configured to illuminate a mask;
a projection optical system configured to project a pattern of the mask onto the substrate; and
a driving mechanism configured to drive and decenter at least one optical element of the illumination optical system with respect to an optical axis of the projection optical system, or to drive and decenter at least one optical element of the projection optical system with respect to an optical axis of the illumination optical system, wherein the driving mechanism changes rotational asymmetry distortion that occurs at a position defocused from a focus position of the projection optical system, by decentering the optical element and relatively decentering the optical axis of the illumination optical system and the optical axis of the projection optical system.

17. A method for manufacturing an article from a substrate, the method comprising:

exposing the substrate to light by using an apparatus; and developing the substrate exposed to light, wherein the article is obtained from the developed substrate, wherein the apparatus including:

an illumination optical system configured to illuminate a mask;

a projection optical system configured to project a pattern of the mask onto the substrate; and a driving mechanism configured to drive and decenter at least one optical element of the illumination optical system with respect to an optical axis of the projection optical system, or to drive and decenter at least one optical element of the projection optical system with respect to an optical axis of the illumination optical system, and wherein rotational asymmetry distortion that occurs at a position defocused from a focus position of the projection optical system is changed by decentering the optical element by the driving mechanism, wherein the method further comprises:

acquiring information about a defocus amount when the substrate is exposed to light and information about a target shape of the rotational asymmetry distortion when the substrate is exposed to light;

calculating a decentering amount of the optical element based on the defocus amount and the target shape; and controlling the driving mechanism by using the calculated decentering amount.

18. A method for manufacturing an article from a substrate, the method comprising:

exposing the substrate to light by using an apparatus; and developing the substrate exposed to light, wherein the article is obtained from the developed substrate, wherein the apparatus including:

an illumination optical system configured to illuminate a mask;

a projection optical system configured to project a pattern of the mask onto the substrate; and a driving mechanism configured to drive and decenter at least one optical element of the illumination optical system with respect to an optical axis of the projection optical system, or to drive and decenter at least one optical element of the projection optical system with respect to an optical axis of the illumination optical system, wherein the driving mechanism changes rotational asymmetry distortion that occurs at a position defocused from a focus position of the projection optical system, by decentering the optical element and relatively decentering the optical axis of the illumination optical system and the optical axis of the projection optical system.

* * * * *